(12) United States Patent
DiStefano et al.

(10) Patent No.: US 6,306,752 B1
(45) Date of Patent: Oct. 23, 2001

(54) CONNECTION COMPONENT AND METHOD OF MAKING SAME

(75) Inventors: Thomas H. DiStefano, Monte Sereno; Joseph Fjeslstad, Sunnyvale; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/396,048

(22) Filed: Sep. 15, 1999

Related U.S. Application Data
(60) Provisional application No. 60/100,378, filed on Sep. 15, 1998.

(51) Int. Cl.[7] .................................................. H01L 21/4763
(52) U.S. Cl. .......................... 438/618; 438/611; 438/613; 438/691; 438/754; 216/14; 216/52; 216/53; 216/56
(58) Field of Search .................................... 438/618, 691, 438/754, 611, 613; 216/14, 52, 53, 56

(56) References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,518,964 | 5/1996 | DiStefano et al. | 437/209 |
| 5,536,909 | 7/1996 | DiStefano et al. | 174/261 |
| 5,590,460 | 1/1997 | DiStefano et al. | 29/830 |
| 5,679,194 | * 10/1997 | Fjelstald et al. | 156/150 |
| 6,044,548 | * 4/2000 | Distefano et al. | 29/840 |
| 6,083,837 | * 7/2000 | Millet | 438/691 |

* cited by examiner

*Primary Examiner*—Amir Zarabian
*Assistant Examiner*—Pho Luu
(74) *Attorney, Agent, or Firm*—Lerner, David, Littenberg, Krumholz & Mentlik, LLP (57) ABSTRACT

A method of making a connection component for a microelectronic element includes providing a sheet comprising an electrically conductive layer, a photoresist layer overlying the conductive layer and a photoimageable dielectric layer disposed under the conductive layer. The method includes lithographically forming at least one opening in the photoresist layer to uncover a portion of the conductive layer, forming a plurality of circuit features from the conductive layer by removing the uncovered portion of the conductive layer, at least some of the circuit features being leads, and lithographically forming at least one aperture in the photoimageable dielectric layer.

26 Claims, 7 Drawing Sheets

CONNECTION COMPONENT AND METHOD OF MAKING SAME

CROSS REFERENCE TO RELATED APPLICATIONS

This application claims benefit of U.S. Provisional Patent Application with Ser. No. 60/100,378, filed on Sep. 15, 1998, the disclosure of which is hereby incorporated by reference herein.

BACKGROUND OF THE INVENTION

1. Field of the Invention

This invention relates to semiconductor chip packages and more specifically to connection components for use in semiconductor chip packages.

2. Description of the Related Art

Connection components are frequently used to make semiconductor chip packages. Certain semiconductor chip packages are made by bonding the contacts on the chip to leads on the connection component. Such semiconductor chip packages include packages made using tape automated bonding techniques wherein the connection component is a copper clad polyimide tape. Other semiconductor chip packages made with connection components include certain chip scale packages which are made by bonding the chip to a flexible interposer such as those disclosed in commonly assigned U.S. Pat. Nos. 5,148,265 and 5,148,266, the disclosures of which are hereby incorporated herein by reference.

One of the problems associated with the use of such tape or chip carriers is the high cost of processing the polyimide. The cost of the gold that is plated onto such carriers also contributes to the high cost of such chip carriers. It is desirable, therefore, to reduce the cost of the chip carrier by eliminating the use of sheets of polyimide and by significantly decreasing the amount of gold used.

SUMMARY OF THE INVENTION

One aspect of the present invention provides a method of making a connection component for use in packaging a microelectronic element such as a semiconductor chip or wafer. The method of this aspect of the invention includes the step of providing a composite sheet comprising a photoresist layer, an electrically conductive layer and a photoimageable dielectric layer. Portions of the photoresist layer are exposed to ultraviolet light and the photoresist layer is then developed to uncover selected portions of the conductive layer. The uncovered portions are etched to form leads and other conductive elements. The remaining photoresist layer is removed. Apertures are formed in the photoimageable dielectric layer using photolithographic techniques whereby portions of the photoimageable dielectric layer are exposed to ultraviolet light. The photoimageable dielectric layer is then developed, usually by immersing such layer in or spraying such layer with a development solution and dissolving away either the light-exposed or the unexposed portions.

In preferred embodiments, the connection component made by the method of this aspect of the present invention includes a photoimageable dielectric layer having a plurality of apertures and a plurality of electrically conductive leads disposed on such photoimageable dielectric layer. This connection component may be used to package a semiconductor chip by juxtaposing the chip with the connection component such that each chip contact is aligned with the tip of one of the leads. In preferred embodiments, the apertures include bond windows and holes for solder balls; and a least a portion of each lead is disposed over one of the bond windows. The chip contacts are then bonded to the leads, preferably by inserting a bonding tool through the bond window. The assembly may then be encapsulated. In preferred embodiments, a solder ball is disposed in each solder ball hole and is electrically connected to one of the leads.

DETAILED DESCRIPTION OF THE PREFERRED EMBODIMENTS

Figure 1:
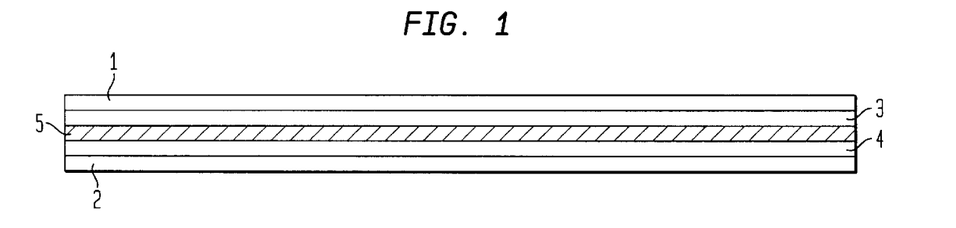
FIGS. 1–11 show side views of progressive steps in the method of making a connection component of the present invention.

One embodiment of the present invention provides a method of making a connection component. Referring to FIG. 1, a composite sheet, comprised of an electrically conductive layer 5 having a first or top surface and a second or bottom surface, a photoresist layer 3 disposed on the top surface, and a photoimageable dielectric layer 4 disposed on the bottom surface, is provided. In preferred embodiments, the conductive layer is comprised of copper and is about 12 to 18 microns thick. In preferred embodiments and as depicted in FIG. 1, the composite sheet also has a first release liner disposed on the top surface of photoresist layer 3 and a second release liner 2 disposed on the bottom surface of the photoimageable dielectric layer 4. The first release liner may be removed before the step of exposing the photoresist layer. In preferred embodiments however, first release layer 1 is not removed until after the step of exposing the photoresist layer. In such preferred embodiments, first release layer 1 is transparent to the light used to activate the photoresist layer.

Figure 2:
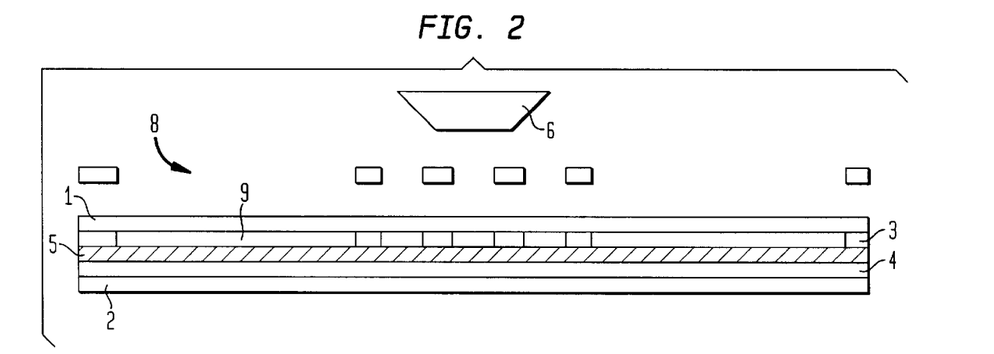
Figure 3:
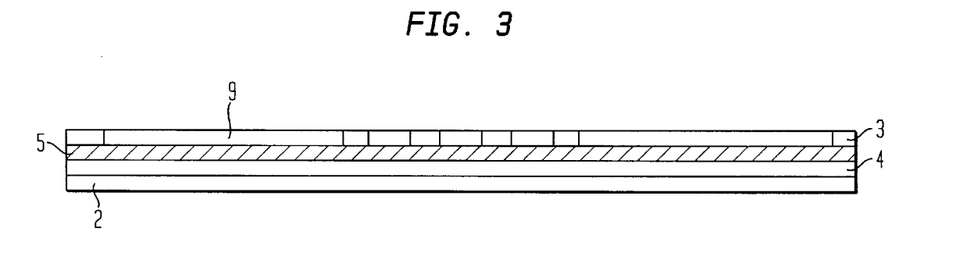
Figure 4:
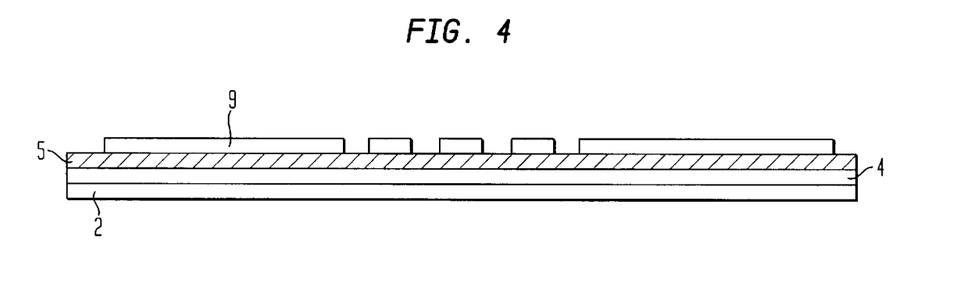
Figure 5:
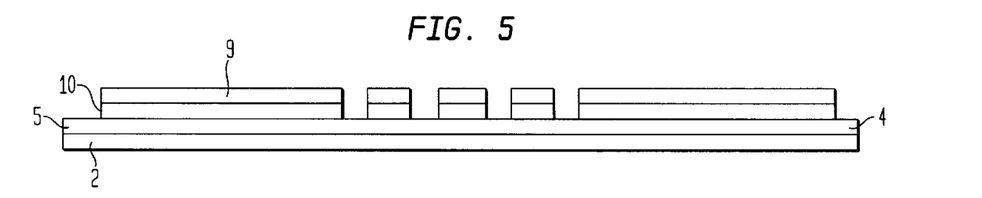
Figure 6:
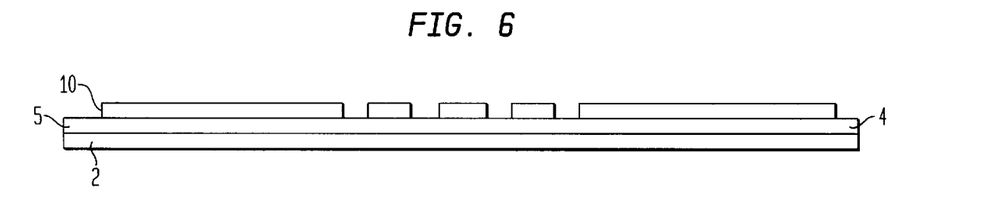

The method of this aspect of the invention also includes the step of selectively exposing portions of the photoresist layer to light having a wavelength and intensity that is sufficient to activate the exposed portions of the photoresist layer. The specific wavelength and intensity of the light required varies depending on the specific photoresist used. In preferred embodiments of the present invention, the photoresist layer is activated by ultraviolet light. As depicted in FIG. 2, an ultraviolet light source 6 and a mask 7 are provided. Mask 7 has a plurality of openings 8 which correspond to circuit features which are to be formed on conductive layer 5. Portions of the photoresist layer are exposed to ultraviolet ("UV") light from UV light source 6 to form light-exposed portions 9. As depicted in FIG. 3, first release liner 1 is removed. The photoresist layer is then developed to remove all but the light-expose portions 9 of photoresist layer 3 and thereby uncover portions of the conductive layer. In preferred embodiments and as depicted in FIG. 4, the photoresist layer is developed by exposing such layer to a developing solution which preferentially dissolves the portions of the photoresist layer which have not been uv-light exposed. Such photoresist layers are generally referred to as "negative" or "negative-acting" photoresists. "Positive" photoresist materials, wherein the developing solution preferentially dissolves the light exposed portions, may also be used. As depicted in FIG. 5, the uncovered portions of the conductive layer are then etched to form circuit features, such as leads 10. The remaining portions 9 of the photoresist layer are then removed, as depicted in FIG. 6. In preferred embodiments, each lead has a notch or a frange point. The frange point is a section of the lead that has been designed to preferentially break upon the application of force to the lead and to bond to a contact on a chip when heat and or pressure is applied to the frange point. The frange point is typically located between the terminal end and the tip end of the lead. Alternative or additionally, the leads may be peelable. Methods for making peelable are disclosed in commonly assigned U.S. patent applications with Ser. Nos. 09/200,100 filed on Nov. 25, 1999; 09/020,750 filed on Feb. 9, 1998; and 09/140,589 filed on Aug. 26, 1998.

Figure 7:
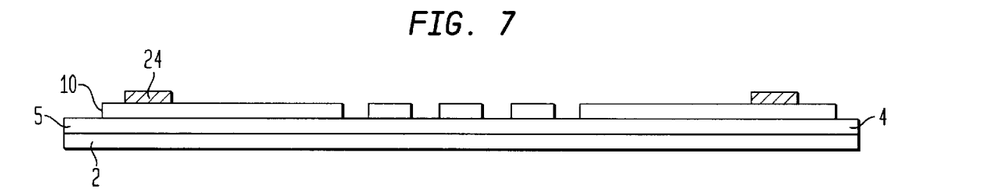

In preferred embodiments and as depicted in FIG. 7, a bonding material, such as gold or another oxidation resistant metallic material 24 is applied to each lead 10. More preferably, and in order to minimize the cost of the connection component by minimizing the amount of gold used, gold is spot welded, or spot electroplated, to the portion of each chip which will be bonded to one of the contacts of the microelectronic element. In preferred embodiments, gold 24 is spot welded to each lead 10 at or near the tip end 21 of each lead.

The method of this aspect of the invention also includes the step of selectively exposing portions of the photoimageable dielectric layer to light having a wavelength and intensity that is sufficient to activate the exposed portions of the photoimageable dielectric layer. The specific wavelength and intensity of the light required varies depending on the specific photoimageable material used. In preferred embodiments of the present invention, the photoimageable dielectric layer is activated by ultraviolet light. Preferred photoimageable polymeric materials are chemically resistant, have good thermal resistance properties and a flexible. Preferred photoimageable dielectric materials include photoimageable polymeric materials, such as, for example, photoimageable, photoimageable acrylics, and photoimageable urethanes, and mixtures thereof. More preferred photoimageable dielectric materials include Dupont's Pyralux® PC 1000 which contains a combination of acrylic, urethane, and imide-based materials, and Dupont's Riston® Photopolymer Dry Film Resists.

Figure 8:
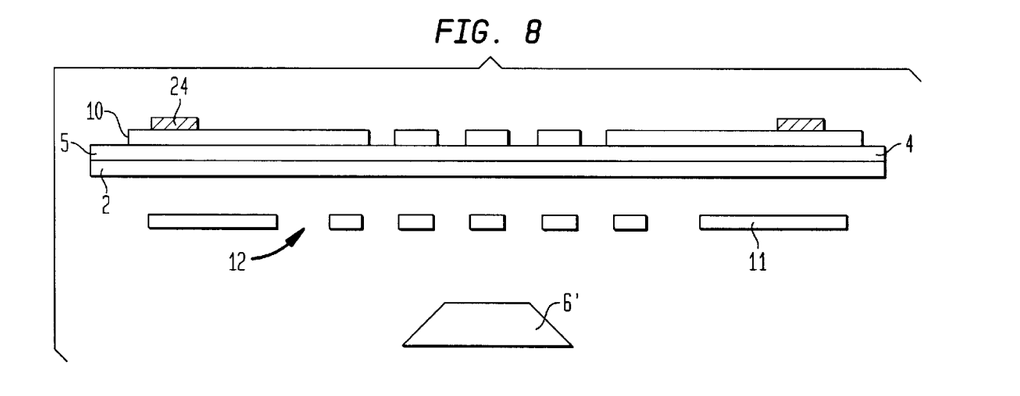
Figure 9:
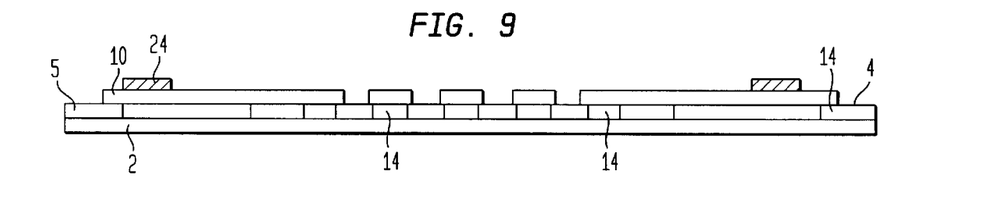
Figure 10:
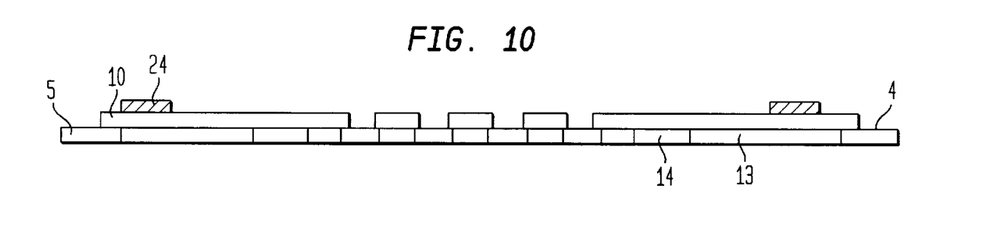
Figure 11:
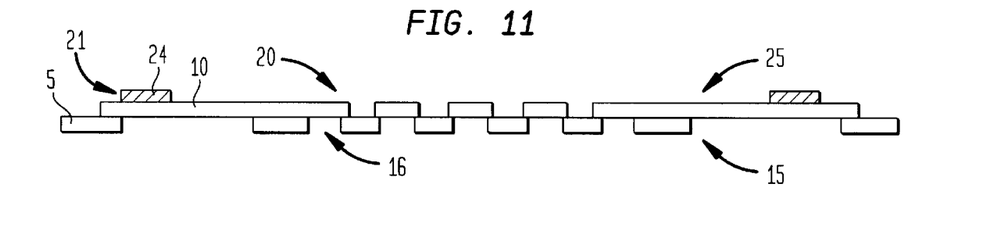

As depicted in FIG. 8, a light source 6' and a mask 11 are provided. Mask 11 has a plurality of openings 12 which correspond to apertures which are to be formed in photoimageable dielectric layer 4. As depicted in FIG. 9, the portion of the photoimageable dielectric layer 4 that is exposed to source 6' form light-exposed portions 14. As depicted in FIG. 10, second release liner 2 is then removed. The photoimageable dielectric layer 4 is then developed to form apertures by removing all of the photoimageable layer 4 except for the light exposed portions 14. Such apertures may include bond windows 15 or holes 16 for the subsequent placement of solder balls or, as depicted in FIG. 11, such apertures may include both bond windows 15 and holes 16. In preferred embodiments, the photoimageable dielectric layer is developed by exposing such layer to a developing solution which preferentially dissolves the portions of the photoimageable dielectric layer which have not be exposed to the UV light. Such photoimageable dielectric layers are referred to herein as "negative photoimageable" materials.

"Positive photoimageable" materials, wherein the developing solution preferentially dissolves the light exposed portions, may also be used. The assembly depicted in FIG. 11 is a connection component 25. Connection component is comprised of dielectric layer 5 and a plurality of electrically conductive leads 10 disposed on such dielectric layer. Dielectric layer 5 has bond windows 15 and a plurality of holes 16, each of which is adapted for placement of a bonding element, such as a solder ball, therein. Each of the leads 10 has a tip end 21 and a terminal end 20. In preferred embodiments, the terminal end 20 of each lead is disposed over one of the holes 16. In particularly preferred embodiments, at least a portion of each lead, at or near the tip end of such lead, is coated with gold or another oxidation resistant metal or metal alloy.

The connection component of the present invention can be use to package microelectronic elements, such as semiconductor chips and wafers, in either batch (e.g. panel) or continuous (e.g. reel to reel) processes. Because continuous process methods tend to be less expensive, it is preferable to provide the composite sheet on a roll so that the packaging process can be conducted in a reel to reel format.

Figure 12:
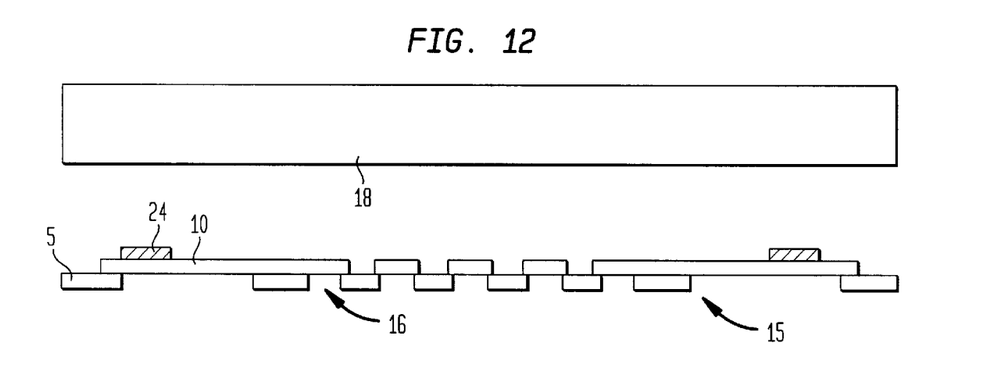
FIGS. 12–15 show side views of progressive steps in the method of making a semiconductor chip package using the connection component of FIG. 11.
Figure 13:
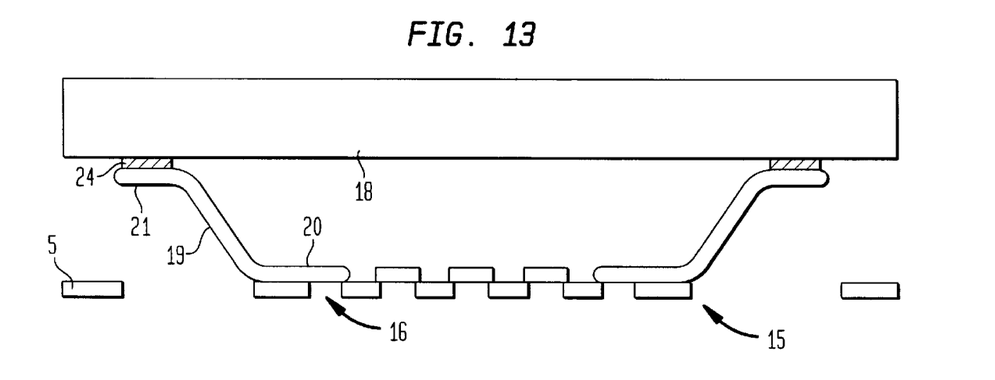
Figure 14:
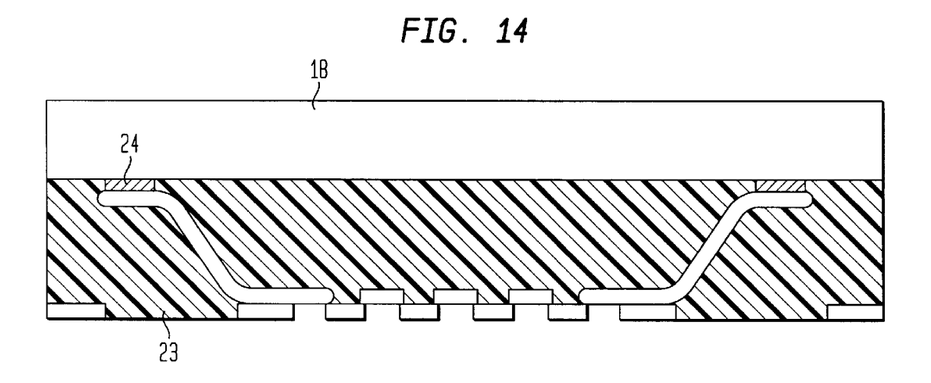

Another embodiment of the present invention provides a method of making a microelectronic element package using the connection component of FIG. 11. Referring to FIG. 12, a semiconductor chip 18 having a plurality of contacts (not shown) is juxtaposed with the connection component of FIG. 11. Elongated leads 10 are vertically extended to form vertically extended leads 19 and the tip end 21 of each lead is bonded to one of the contacts on the semiconductor chip, as depicted in FIG. 13. In preferred embodiments the leads are vertically extended and thermosonically bonded by inserting a bonding tool through bonding window 15. In preferred embodiments and as depicted in FIG. 14, an encapsulant layer 23 may be disposed between the semiconductor chip and the connection component to encapsulate the leads. In particularly preferred embodiments, encapsulant layer 23 is comprised of a compliant layer which is adapted to compensate for the mismatch in the thermal coefficients of expansion of the chip and the connection component. Compliant layer 23 is preferably comprised of a silicone elastomer or a flexiblized epoxy. In an alternative embodiment, compliant layer 23 is disposed directly on the connection component before the connection component is juxtaposed with a semiconductor chip or a semiconductor wafer.

Figure 15:
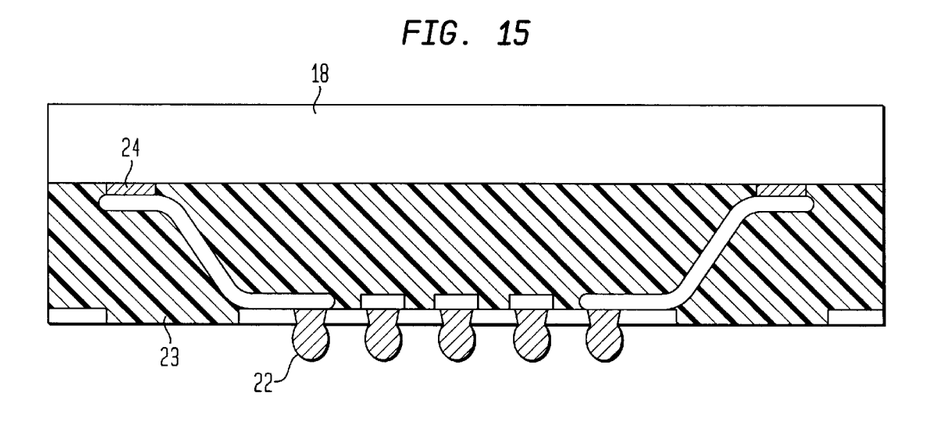

In preferred embodiments and as depicted in FIG. 15, the microelectronic element package includes a plurality of bonding elements 22, such as solder balls. The solder balls are typically attached to the package by disposing one solder ball in each aperture and reflowing the solder ball to electrically interconnect it with one of the terminals.

Figure 16:
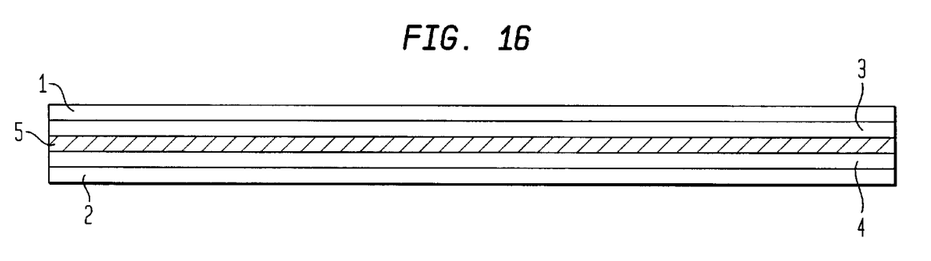
FIGS. 16–21 show side views of progressive steps in another embodiment of the method of making a connection component of the present invention.
Figure 17:
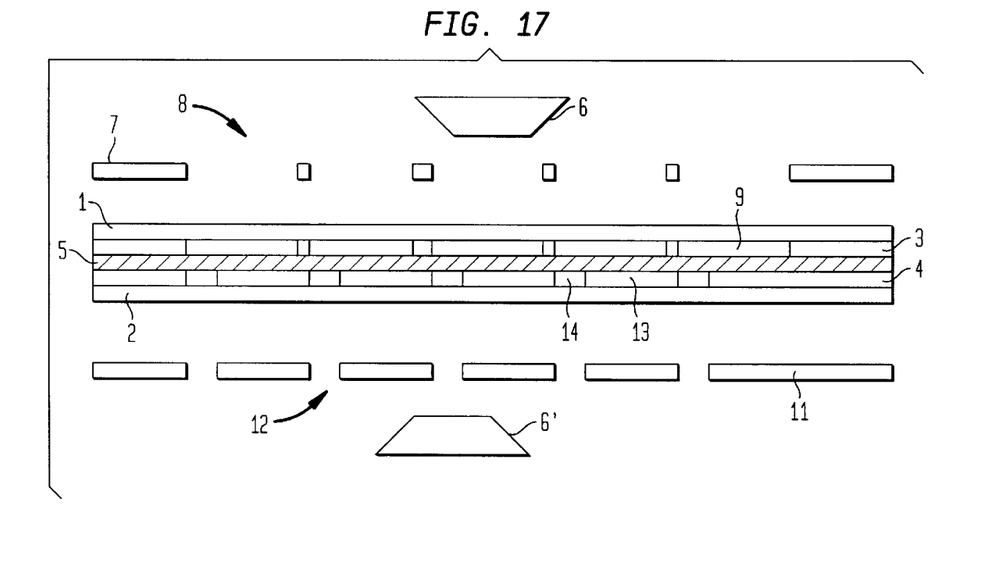

Another embodiment of the present invention provides a method of making a connection component using a positive acting photoimageable dielectric material. As depicted in FIG. 16, the composite comprises an electrically conductive layer 5, a photoresist layer 3, a photoimageable dielectric layer 4, a first release liner 1 disposed on the photoresist layer and a second release liner 2 disposed on the photoimageable dielectric layer. As depicted in FIG. 17, the photoresist layer 3 is exposed to an UV light source 6 through mask 7. Mask 7 has a plurality of openings 8. Although positive photoresists may also be used, the photoresist of FIG. 17 is a negative acting photoresist. Since the photoresist used is negative acting, the light exposed portion 9 of the photoresist layer is not removed when the developing solution is applied to layer 3.

Figure 18:
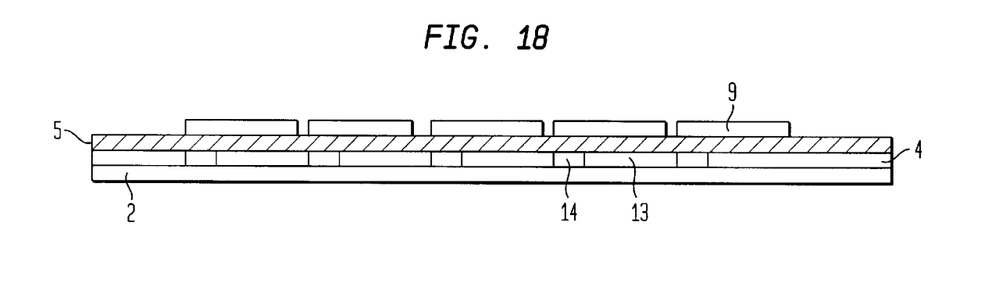
Figure 19:
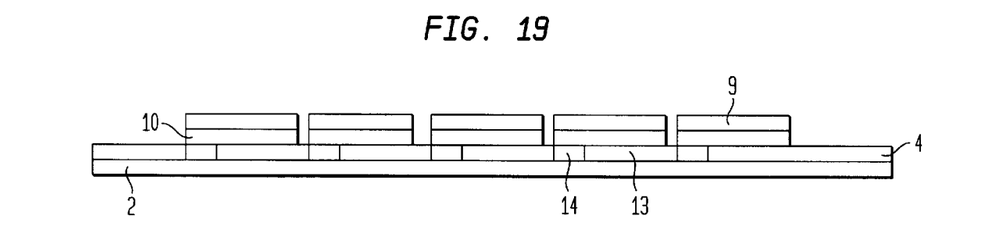
Figure 20:
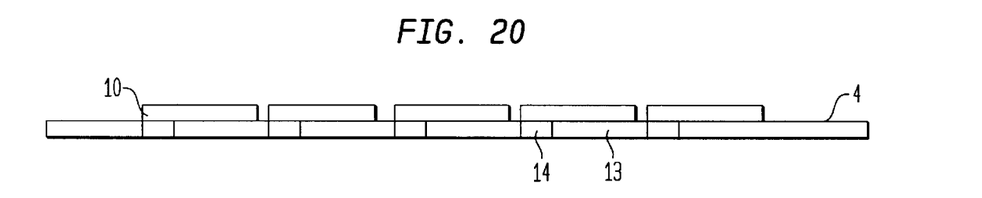

The photoimageable dielectric layer 4 is exposed to an UV light source 6' through a mask 11 having a plurality of openings 12. Because the photoimageable dielectric layer 4 depicted in FIG. 17 is positive acting the light exposed portion 14 of layer 4 is preferentially removable in a developing solution. The mask used to expose the dielectric layer should, if the dielectric material is made of a positive photoimageable dielectric layer, have openings or uv-light transparent sections which correspond to portions of the dielectric layer which will have bond windows or apertures for locating solder balls. In preferred embodiments, the first release liner and the second release are transparent to UV light so that the photoresist layer and the photoimageable layer may be exposed to UV light without having to remove the liners. In preferred embodiments, the photoresist layer and the photoimageable dielectric layer are simultaneously exposed to the UV light sources. The first release liner is then removed, as depicted in FIG. 18, and the photoresist layer is developed such that all but the light exposed portions 9 of such layer 3 are removed. Portions of the conductive layer are thereby uncovered. As depicted in FIG. 19, the uncovered portions of the conductive layer are then etched to form electrically conductive circuit features such as leads 10. As depicted in FIG. 20, the light-exposed portions 9 of photoresist layer 3 are then removed, usually using a photoresist stripping solution. The second release liner 2 is peeled or otherwise removed from the photoimageable dielectric layer 4. The light-exposed portions 14 of the photoimageable dielectric layer 4 are then removed to create apertures 16 in layer 4 of the connection component of FIG. 21. Portions 14 are generally removed by immersing the assembly in a solution that preferentially removes portions 14 while allowing portions 13 to remain. Alternatively, portions 14 may be removed by spraying such a solution onto layer 4. In preferred embodiments, a bonding material, such as gold or another oxidation resistant metal is spot welded to the tip end of each lead.

Figure 21:
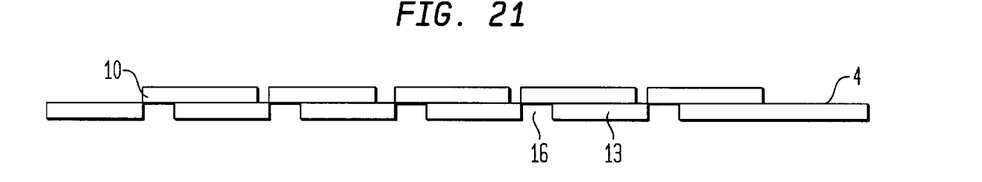
Figure 22:
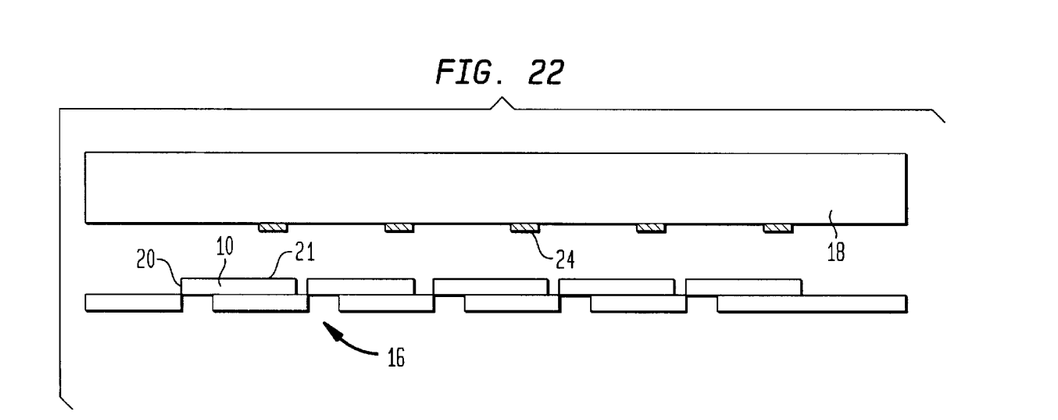
FIGS. 22–26 show side views of progressive steps in the method of making a semiconductor chip package using the connection component of FIG. 21.
Figure 23:
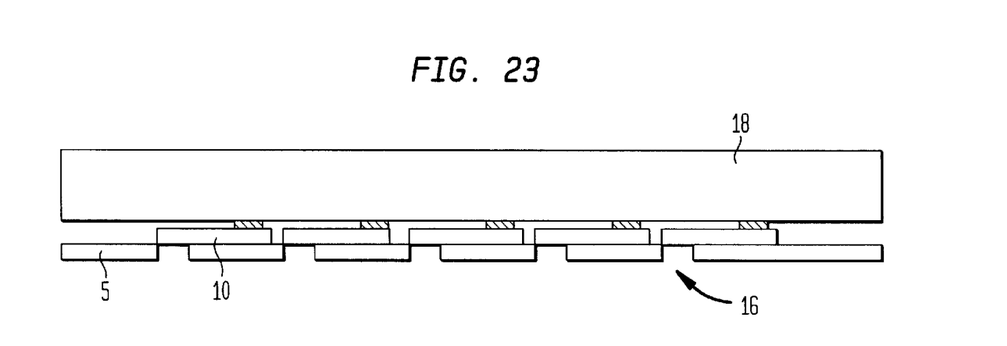
Figure 24:
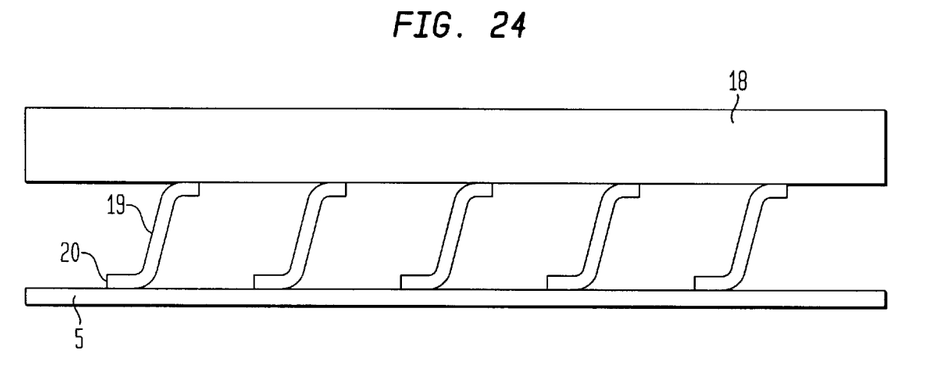
Figure 25:
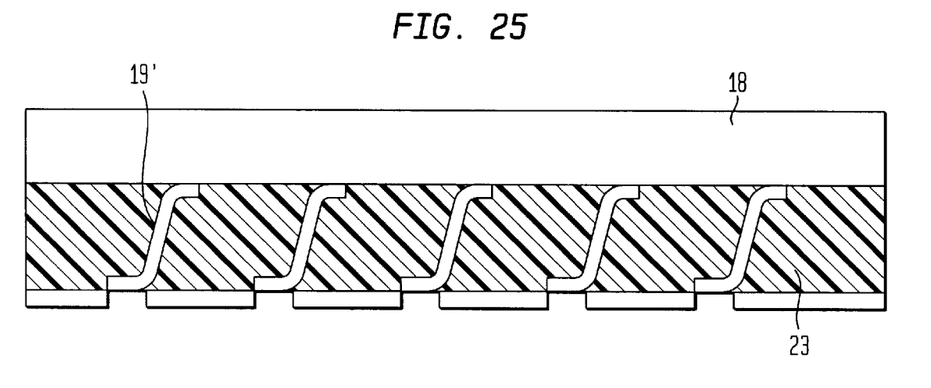

Another embodiment of the present invention provides a method of making a microelectronic element package using the connection component of FIG. 21. Referring to FIG. 22, a semiconductor chip or wafer 18 having a plurality of contacts 24 is juxtaposed with the connection component of FIG. 21. The tip end 21 of each lead 10 is bonded to one of the contacts 24, as depicted in FIG. 23. The terminal end 20 of each lead is disposed over an aperture 16. Elongated leads 10 are vertically extended to form vertically extended leads 19 and the tip end 21 of each lead is bonded to one of the contacts on the wafer 18, as depicted in FIG. 24. Methods for vertically extending the leads include, for example, methods disclosed in commonly assigned U.S. Pat. No. 5,518,964, the disclosure of which is incorporated herein by reference. In preferred methods, the leads are extended by moving the wafer 18 and the connection component away from each other in a direction having a vertical component of motion. In preferred embodiments and as depicted in FIG. 25, an encapsulant 23 is disposed between the wafer 18 and the photoimageable dielectric layer to encapsulate the leads. In particularly preferred embodiments, encapsulant layer 23 is comprised of a compliant layer which is adapted to compensate for the mismatch in the thermal coefficients of expansion between the wafer and the connection component. Compliant layer 23 is preferably comprised of a silicone elastomer or a flexiblized epoxy.

Figure 26:
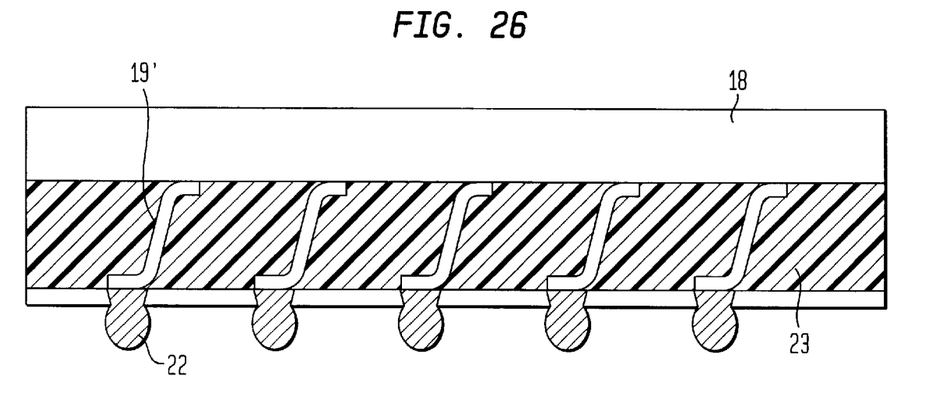

In preferred embodiments and as depicted in FIG. 26, the microelectronic element package includes a plurality of bonding elements 22, such as solder balls. The solder balls are typically attached to the package by disposing one solder ball in each aperture and reflowing the solder ball to electrically interconnect it with one of the terminals.

The resulting wafer may be diced into individual packages including one or more semiconductor chips. In alternative embodiments, the packaged wafer may be diced before the solder balls are attached or before the package is encapsulated. Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

That which is claimed is:

1. A method of making a connection component for a microelectronic element, comprising:

A. providing a composite sheet comprising;
        1) an electrically conductive layer having a first surface and a bottom surface opposite the top surface;
        2) a photoresist layer disposed on the first surface of the conductive layer; and
        3) a photoimageable dielectric layer disposed on the bottom surface of the conductive layer;
    B. lithographically forming at least one opening in the photoresist layer to uncover a portion of the conductive layer;
    C. forming a plurality of circuit features from the conductive layer by removing the uncovered portion of the conductive layer, wherein at least some of the circuit features are leads; and
    D. lithograpically forming at least one aperture in the phototimageable dielectric layer.

2. The method of claim 1, wherein the photoresist layer includes a negative-acting photoresist and the step of lithographically forming at least opening in the photoresist layer includes the steps of:

i) selectively exposing at least one portion of the photoresist layer to light to create cured and uncured portions of the photoresist layer; and
    ii) removing the uncured portion of the photoresist layer to uncover a portion of the conductive layer.

3. The method of claim 2, wherein the step of lithograpically forming at least one aperture includes the steps of:

a) exposing the photoimageable dielectric layer to light through a mask to selectively create cured and uncured portions of the photoimageable dielectric layer; and
    b) removing the uncured portion of the photoimageable dielectric layer to form at least one aperture.

4. The method of claim 3, wherein the light used to expose the photoresist layer and the photoimageable dielectric layer is ultraviolet light.

5. The method of claim 4, wherein the steps of exposing the photoimageable dielectric layer and the photoresist layer to ultraviolet light are completed before the uncured portion of the photoresist layer is removed.

6. The method of claim 5, wherein the steps of exposing the photoresist layer and exposing the photoimageable dielectric layer are conducted simultaneously.

7. The method of claim 6, wherein the composite sheet further comprises a first release liner disposed on the photoresist layer and a second release liner disposed on the photoimageable dielectric layer.

8. The method of claim 7, further comprising the steps of:

E. removing the first release liner; and
    F. removing the second release liner.

9. The method of claim 8, wherein the first release liner is at least partially transparent to the ultraviolet light used to expose the photoresist layer and the second release liner is at least partially transparent to the ultraviolet light used to expose the photoimageable dielectric layer.

10. The method of claim 9, wherein the step of removing the first and second release liners is completed after the steps of exposing the photoresist layer and the photoimageable dielectric layer to light.

11. The method of claim 10, wherein the step of removing the second release liner is done after the step of removing the uncovered portion of the conductive layer.

12. The method of claim 1, wherein each of the leads has a tip end and a terminal end and the method further comprises the step of depositing a bonding material to the tip end of each of the leads.

13. The method of claim 12, wherein the step of depositing a bonding material includes the step of spot welding gold.

14. The method of claim 12, wherein the at least one aperture of the photoimageable dielectric layer includes a plurality of apertures.

15. The method of claim 14, wherein one of the apertures is disposed under the terminal end of each of the leads.

16. The method of claim 14, wherein at least of the apertures is adapted for use as a bonding window.

17. A method of packaging a microelectronic element comprising:

providing a connection component made according the method of claim 14;

providing a microelectronic element have a plurality of contacts; and connecting the tip end of each of the leads to one of the contacts.

18. The method of claim 17, further comprising the step of disposing a compliant layer between the microelectronic element and the connection component.

19. The method of claim 18, wherein the leads are vertically extended during the step of encapsulating the microelectronic element.

20. The method of claim 17, wherein at least one of the apertures is disposed under each of the terminals.

21. The method of claim 20, further comprising the steps of disposing a bonding element in each of the apertures disposed under a terminal and bonding the bonding element to the terminal.

22. The method of claim 21, wherein each bonding element is a solder ball.

23. The method of claim 17, wherein the microelectronic element is a semiconductor chip.

24. The method of claim 17, wherein the microelectronic element is a semiconductor chip.

25. The method of claim 1, wherein the conductive layer is comprised of a metal selected from the group consisting of copper and copper alloys and the photoimageable dielectric layer is comprised of a photoimageable epoxy.

26. A connection component made according to the method of claim 1.

* * * * *

UNITED STATES PATENT AND TRADEMARK OFFICE
CERTIFICATE OF CORRECTION

PATENT NO. : 6,306,752 B1
DATED : October 23, 2001
INVENTOR(S) : DiStefano et al.

It is certified that error appears in the above-identified patent and that said Letters Patent is hereby corrected as shown below:

<u>Title page,</u>
Item [75], Inventors, "Fjeslstad" should read -- Fjelstad --.

<u>Column 1,</u>
Line 4, "ROSS" should read -- CROSS --

<u>Column 2,</u>
Line 37, after "liner" insert -- 1 --.

<u>Column 4,</u>
Line 4, after the second occurrence of "component" insert -- 25 --.

<u>Column 6,</u>
Line 7, "Having" should start a new paragraph.

Signed and Sealed this

Twenty-sixth Day of March, 2002

Attest:

*Attesting Officer*

JAMES E. ROGAN
*Director of the United States Patent and Trademark Office*